United States Patent [19]

Hamano et al.

[11] Patent Number: 5,066,877
[45] Date of Patent: Nov. 19, 1991

[54] DATA DELAY CIRCUIT AND CLOCK EXTRACTION CIRCUIT USING THE SAME

[75] Inventors: Hiroshi Hamano, Kawasaki; Izumi Amemiya, Yokohama; Takuji Yamamoto, Kawasaki; Yasunari Arai, Tokyo; Takeshi Ihara, Kawasaki, all of Japan

[73] Assignee: Fujitsu Limited, Kawasaki, Japan

[21] Appl. No.: 662,502

[22] Filed: Feb. 28, 1991

Related U.S. Application Data

[63] Continuation of Ser. No. 467,246, Jan. 19, 1990, abandoned.

[30] Foreign Application Priority Data

Jan. 19, 1989 [JP] Japan .................................. 1-8645

[51] Int. Cl.⁵ .................... H03K 5/13; H03K 5/159
[52] U.S. Cl. .................................... 307/603; 307/608
[58] Field of Search ...................... 307/603, 608, 494

[56] References Cited

U.S. PATENT DOCUMENTS

| | | | |
|---|---|---|---|
| 2,976,432 | 3/1961 | Gieckle, Jr. .................. | 307/608 |
| 4,687,998 | 8/1987 | Takatori et al. .............. | 307/494 |
| 4,691,120 | 9/1987 | Kondo ............................ | 307/265 |
| 4,874,966 | 10/1989 | Gehrt et al. .................. | 307/608 |
| 4,893,036 | 1/1990 | Hester et al. ................ | 307/608 |

FOREIGN PATENT DOCUMENTS

| | | |
|---|---|---|
| 0253135 | 6/1987 | European Pat. Off. . |
| 40814 | 1/1987 | Japan . |
| 131720 | 6/1988 | Japan . |

OTHER PUBLICATIONS

IBM Technical Disclosure Bulletin, vol. 16, No. 11, Apr. 1974, pp. 3498-3500, New York.
IBM Technical Disclosure Bulletin, vol. 30, No. 3, Aug. 1987, pp. 1183-1186, Armonk, New York.

*Primary Examiner*—Stanley D. Miller
*Assistant Examiner*—Richard Roseen
*Attorney, Agent, or Firm*—Staas & Halsey

[57] ABSTRACT

A data delay circuit includes a first transistor, and a second transistor having a base, an emitter and a collector. Input data is applied to the bases of the first and second transistors. A constant-current source is coupled between the emitters of the first and second transistors and a negative power source. A capacitor is connected between the collector of the first transistor and the collector of the second transistor. The data delay circuit further includes a third transistor and a fourth transistor. The emitters of the third and fourth transistors are connected to the collectors of the first and second transistors, respectively. The bases of the third and fourth transistors are provided with control data having a polarity opposite to that of the input data and having an adjusted amplitude level corresponding to a desired delay time to be given the input data. First and second load resistors are respectively coupled to the collectors of the third and fourth transistors through a positive power source. Delayed input data is drawn from the collectors of the third and fourth transistors.

15 Claims, 11 Drawing Sheets

STRAY CAPACITY

DATA DELAY CIRCUIT AND CLOCK EXTRACTION CIRCUIT USING THE SAME this application is a continuation of application Ser. No. 07/467,246, fled Jan. 19, 1990, now abandoned.

CROSS-REFERENCE TO RELATED APPLICATIONS

U.S. Pat. application Ser. No. 97/246,088 of Masaaki KAWAI et al. entitled "PHASE SHIFT CIRCUIT" filed Sept. 19, 1988, assigned to the common assignee of the present application, Fujitsu Limited, as shown by the assignment records of the U.S. Patent and Trademark Office, is related to the invention of the present, new U.S. patent application.

BACKGROUND OF THE INVENTION

The present invention generally relates to a data delay circuit and a clock extraction circuit using the same. More particularly, the present invention is directed to a data delay circuit which delays high speed data having a bit rate of a few giga-bits per second and a clock extraction circuit which employs the present data delay circuit and extracts a clock signal from high-speed data.

A transmission system is known which transfers high-speed data having a bit rate of a few giga-bits per second by an optical signal. In such a transmission system, it is required to adjust the phase and duty ratio of high speed data at transmission and reception parts thereof. To meet this requirement, there is a need for a data delay circuit capable of delaying high-speed data by a predetermined time with high precision.

Various different types of delay circuit are known. Those examples are delay circuits using an inductance-capacitance (LC) resonance circuit, a resistance-capacitance (RC) time constant circuit, a coaxial cable and a gate circuit. A delay circuit based on an LC resonance circuit can control the phase of a sine-wave signal by 180° or more. However, the LC-based delay circuit cannot delay signals other than sine-wave signals. In addition, it is difficult to fabricate the LC-based delay circuit in the form of ICs because of the presence of inductance. A delay circuit using a coaxial cable can delay signals other than sine-waves but cannot be integrated. For these reasons, the use of an RC time constant circuit or a gate circuit is effective to make delay circuits compact.

However, a delay circuit using an RC time constant circuit is not suitable for providing high-speed data with an arbitrary delay time with high precision. Additionally, the use of RC time constant causes a deterioration of signal waveform. On the other hand, a delay circuit using a gate circuit requires a plural number of cascaded delay circuits each having a unit delay time as well as selectors used for stepwise adjusting the delay time of the delay circuit. In addition, it is difficult to delay high-speed data by a very small time with high precision.

SUMMARY OF THE INVENTION

It is a general object of the present invention to provide a novel and useful data delay circuit in which the aforementioned disadvantages are eliminated.

A more specific object of the present invention is to provide a data delay circuit that is capable of delaying high-speed data by an arbitrary delay of time without causing a deterioration of signal waveform and that is fabricated in the form of IC.

The above objects of the present invention are achieved by a data delay circuit including a first transistor, and a second transistor having a base, an emitter and a collector. Input data is applied to the bases of the first and second transistors. A constant-current source is coupled between the emitters of the first and second transistors and a negative power source. A capacitor is connected between the collector of the first transistor and the collector of the second transistor. The data delay circuit further includes a third transistor and a fourth transistor. The emitters of the third and fourth transistors are connected to the collectors of the first and second transistors, respectively. The bases of the third and fourth transistors are provided with control data having the polarity opposite to that of the input data and having an adjusted amplitude level corresponding to a desired delay time to be given the input data. First and second load resistors are respectively coupled to the collectors of the third and fourth transistors through a positive power source. Delayed input data or output data is drawn from the collectors of the third and fourth transistors.

The above-mentioned data delay circuit may be cascaded to obtain a large delay of time.

Another object of the present invention is to provide a clock extraction circuit using the aforementioned data delay circuit.

This object of the present invention is achieved by a timing extraction circuit comprising data delay circuit having an input terminal and an output terminal, and an exclusive-OR gate having a first input terminal to which input data is applied, a second input terminal coupled to the output terminal of the data delay circuit, and an output terminal. The data delay circuit includes a first transistor having a base, an emitter and a collector; a second transistor having a base, an emitter and a collector, the input data being applied to the bases of the first and second transistors through the input terminal of the data delay circuit; a constant-current source coupled between the emitters of the first and second transistors and a negative power source; a capacitor coupled between the collector of the first transistor and the collector of the second transistor; a third transistor having a base, a collector, and an emitter coupled to the collector of the first transistor; a fourth transistor having a base, a collector, and an emitter coupled to the collector of the second transistor, control data, applied to the bases of the third and fourth transistors, having a polarity opposite to that of the input data and having an adjusted amplitude level corresponding to a desired delay time to be given the input data; and first and second load resistors respectively coupled to the collectors of the third and fourth transistors through a positive power source. The delayed input data or output data is drawn from the collectors of the third and fourth transistors through the output terminal of the data delay circuit. The data delay circuit further comprises first means for generating the input data and inverted input data having the polarity opposite to that of the input data from a data signal supplied from an external device, the input data being applied to the bases of the first and second transistors; and second means for adjusting an amplitude level of the inverted data in accordance with the desired delay time to thereby generate the control data applied to the bases of the third and fourth transistors.

DESCRIPTION OF THE PREFERRED EMBODIMENTS

Figure 1:
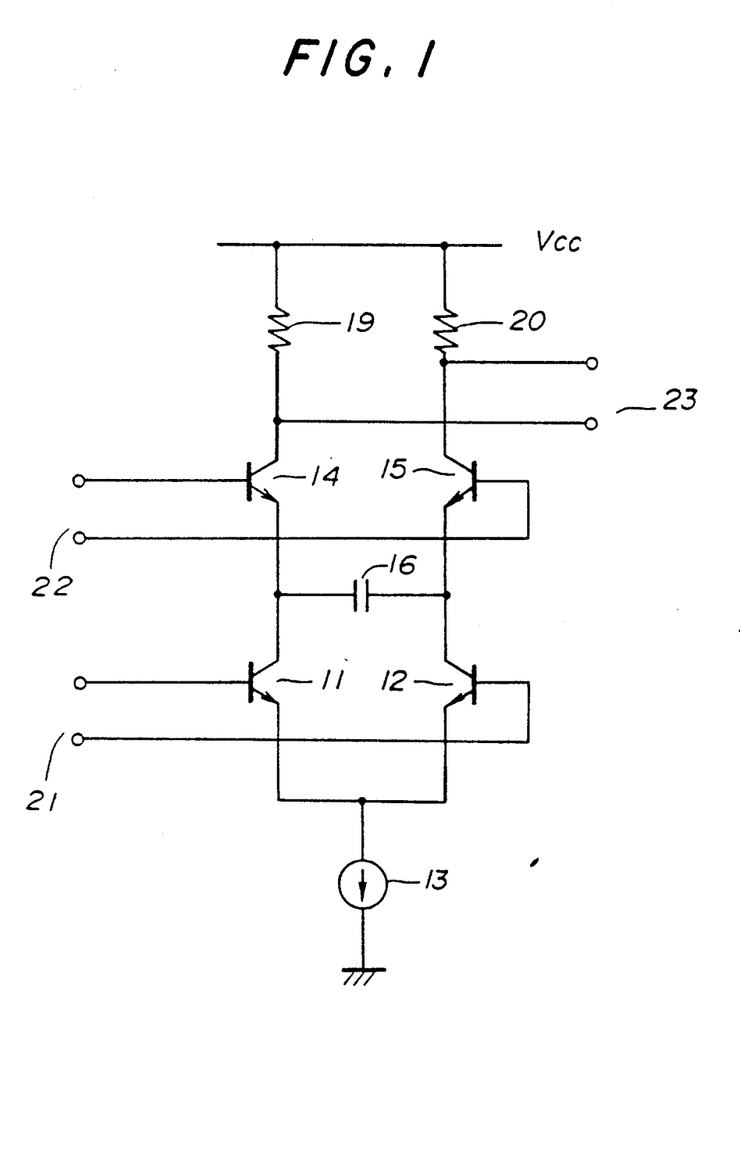
FIG.1 is a circuit diagram illustrating a configuration of the present invention.

Referring to FIG.1, the data delay circuit according to the present invention includes first, second, third and fourth transistors 11, 12, 14 and 15. Input data of the balanced type are applied to the bases of the first and second transistors 11 and 12 through input terminals 21. A constant-current source 13 is connected between ground (or a negative power source) and the emitters of the first and second transistors 11 and 12. The constant-current source 13 is formed in a conventional manner. The emitters of the third and fourth transistors 14 and 15 are connected to the collectors of the first and second transistors 11 and 12, respectively. The bases of the third and fourth transistors 14 and 15 are supplied, through control terminals 22, with control data which is inverted data of the input data applied to the input terminals 21 and has an adjusted amplitude level based on a desired delay of time. A capacitor 16 is connected between the emitters of the third and fourth transistors 14 and 15. In other words, the capacitor 16 is connected between the collectors of the first and second transistors 11 and 12. The collectors of the third and fourth transistors 14 and 15 are connected to output terminals 23, and a positive power source line $V_{CC}$ through load resistors 19 and 20, respectively.

In operation, when input data is applied to the bases of the first and second transistors 11 and 12 through the input terminals 21, control data which is inverted data of the input data and has an adjusted amplitude level is applied to the bases of the third and fourth transistors 14 and 15 through the control data terminal 22. When the applied input data turns the first and second transistors 11 and 12 ON and OFF respectively, for example, the control data has the polarity which causes the third and fourth transistors 14 and 15 to turn OFF and ON, respectively. The capacitor 16 having a charge which was stored therein before the above-mentioned input and control data are applied to the present data delay circuit, is discharged through the first transistor 11. On the other hand, a charge is supplied to the capacitor 16 through the fourth transistor 15. When the input and control data are applied, the emitter potential of the third transistor 14 is increased to a potential which makes the Vbe (base-emitter voltage) below the turn-ON voltage. Thus, the third transistor 14 is completely cut off. Current passing through the capacitor 16 is regulated so as to become a constant current by the constant-current source 13. Thus, the voltage across the capacitor 16 decreases linearly. Then, the capacitor 16 is charged in the direction opposite to the direction in which the capacitor 16 was previously charged. As a result of charging the capacitor 16, the emitter potential of the third transistor 14 decreases, and the emitter potential of the fourth transistor 15 increases.

When the emitter potential of the third transistor 14 becomes low enough to make the base-emitter voltage Vbe over the turn-ON voltage thereof, the third transistor 14 turns ON. When the base-emitter voltage Vbe of the fourth transistor 15 becomes lower than the turn-ON voltage thereof, the fourth transistor 15 turns OFF. That is, it takes a certain time the third transistor 14 to turn ON after the first transistor 11 turns ON. This time is a delay of time caused in the data delay circuit. Similarly, the fourth transistor 15 turns ON with a delay of time after the second transistor 12 turns ON. The delay time changes due to the amplitude level of the control data applied to the basis of the third and fourth transistors 14 and 15. Thus, it is possible to select an arbitrary delay time by adjusting the amplitude level of the control data applied to the bases of the third and fourth transistors 14 and 15.

Figure 2:
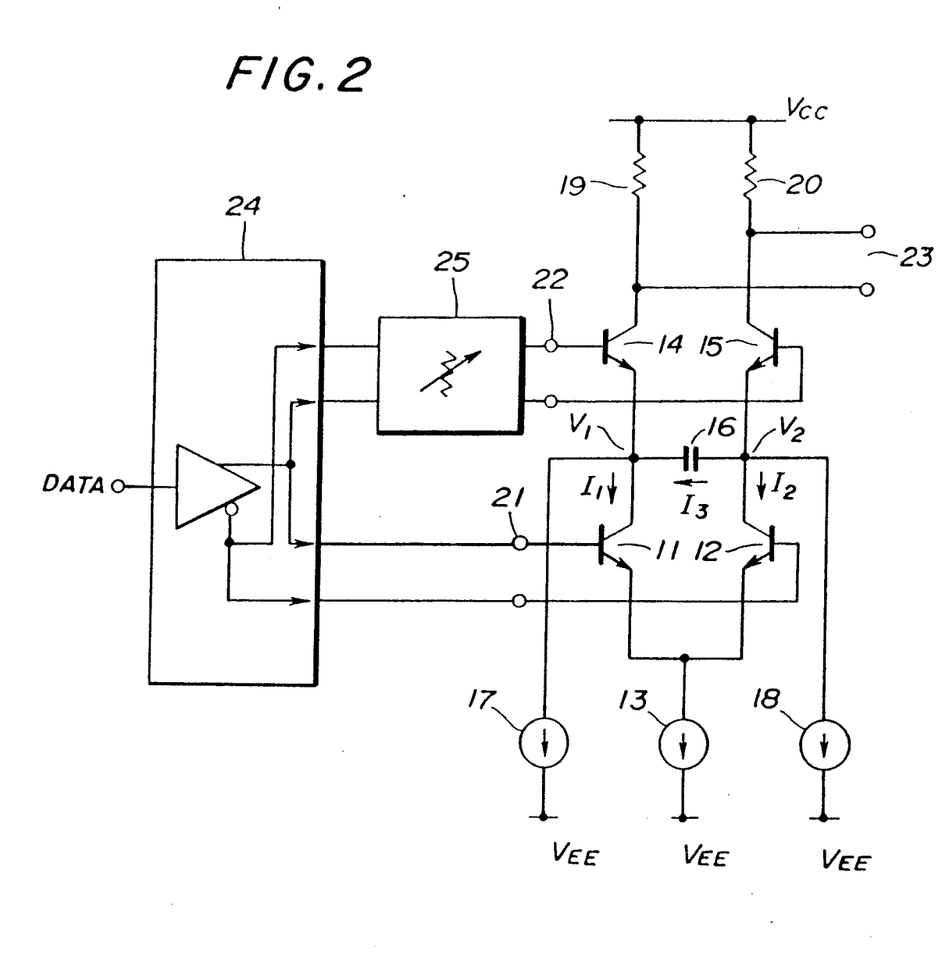
FIG.2 is a circuit diagram of a data delay circuit according to an embodiment of the present invention.

FIG.2 illustrates the aforementioned data delay circuit and its peripheral circuit. In FIG.2, those parts which are the same as those shown in FIG.1 are given the same reference numerals. The peripheral circuit includes a data division circuit 24 and an amplitude level adjustment circuit 25. The data division circuit 24 converts data such as NRZ (non return to zero) codes into two input data, one of which is supplied to the bases of the first and second transistors 11 and 12 through the input terminals 21. The data division circuit 24 also outputs control data which has the polarity opposite to that of the input data. The amplitude level adjustment circuit 25 adjusts the amplitude level of the control data. As described previously, the delay time generated in the data delay circuit is based on the amplitude level of the control data. The control data having an adjusted amplitude level is applied to the bases of the third and fourth transistors 14 and 15 through the control terminals 22.

The first and second transistors 11, 12 and the constant-current source 13 form a differential pair. A very-small current source 17 which is a constant-current source is connected between ground $V_{EE}$ (negative power source) and the collector of the first transistor 11

(the emitter of the third transistor 14). A very-small current source 18 which is a constant-current source is connected to the negative power source $V_{EE}$ and the collector of the second transistor 12 (the emitter of the fourth transistor 15).

Figure 3:
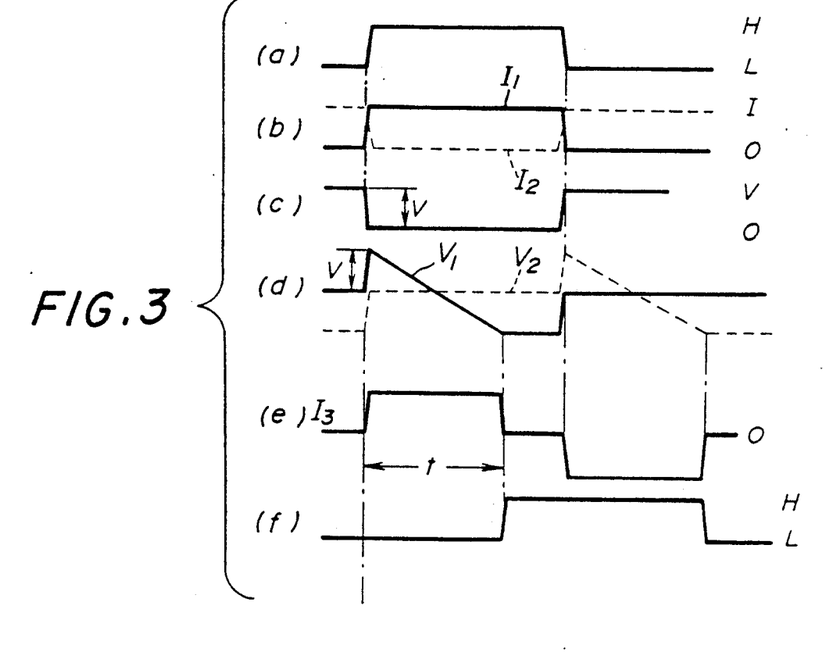
FIG.3 is a waveform diagram of signals obtained at parts of the configuration shown in FIG.2.

FIG.3 is a waveform diagram of signals at parts of the configuration shown in FIG.2. When the input data supplied to the input terminals 21 from the data division circuit 24 rises as shown in (a) of FIG.3, the first transistor 11 turns ON, and the second transistor 12 turns OFF. In response to these changes in the first and second transistors 11 and 12, a current I1 passing through the first transistor 11 becomes a constant current I passing through the constant-current source 13 as indicated by a solid line shown in (b) of FIG.3, and a current I2 passing through the second transistor 12 becomes zero as indicated by a broken line shown in (b) of FIG.3. The control data output from the amplitude level adjustment circuit 25 has a waveform shown in (c) of FIG.3. The control data has the polarity opposite to that of the input data (a), and an adjusted amplitude level V. The control data shown in (c) of FIG.3 is applied to the bases of the third and fourth transistors 14 and 15.

The emitter potential V2 of the fourth transistor 15 increases in accordance with the base potential V, keeping the base-emitter voltage Vbe as a turn-ON voltage, as indicated in (d) of FIG.3. Then the charge stored in the capacitor 16 raises the emitter potential V1 of the third transistor 14 in accordance with the increase of the voltage V2 as indicated by a solid line shown in (d) of FIG.3. That will make the third transistor turn OFF together with the decrease of the base potential which is caused by the control data. Thereby, a current I3 passes from the positive power source $V_{CC}$ to the negative power source $V_{EE}$ through the load resistor 20, the fourth transistor 15, the capacitor 16, the first transistor 11 and the constant-current source 13 in this order. As shown in (d) of FIG.3, the discharging current I3 of the capacitance 16 is the constant current I regulated by the constant-current source 13. As shown in (d) of FIG.3, the emitter potential V1 of the third transistor 14 decreases linearly as indicated by the solid line in accordance with decrease of the voltage across the capacitor 16 due to the constant-current discharge. After discharging the capacitor 16 is completed, the capacitor 16 is charged in the opposite direction.

When the emitter potential V1 of the third transistor 14 reaches the potential which makes the base-emitter voltage Vbe of the transistor 14 enough for turn-ON, charging of the capacitor 16 is finished and the third transistor 14 turns ON. Thus, the constant current I is allowed to pass through the third transistor 14 so that the current I3 passing through the capacitor 16 becomes zero. The collector potential of the third transistor 14 becomes a low level (L; approximately $V_{CC} - IR_L$ so that the logic swing of this delay circuit is defined as $IR_L$ where $R_L$ is the value of load resistor 19 or 20.). Since the current I3 passing through the capacitor 16 from the fourth transistor 15 becomes zero as described above, only a very small current regulated by the very-small current source 18 passes through the fourth transistor 15. As a result, the fourth transistor 15 is held at a state close to the OFF state. In this case, the voltage drop caused across the load resistor 20 is very small so that the collector potential of the fourth transistor 15 becomes a high level (H) approximately equal to the positive power source voltage $V_{CC}$.

In this manner, the delay time is defined as a time t it takes the collector potential of the fourth transistor 15 to reach the high level H after the input data applied to the base of the first transistor 11 switches to the high level H. The delay time t is proportional to (2CV/I) where C is the value of capacitance of the capacitor 16. Since the current I and the capacitance C are both constant, the delay time t can arbitrarily be adjusted by altering the amplitude level V of the control data applied to the control terminals 22.

When the input data applied to the base of the transistor 11 switches to the low level L, the current I1 passing through the first transistor 11 becomes zero, and the base of the second transistor 12 increases to the high level H. Thus, the current I2 through the second transistor 12 becomes equal to the current I. The control data applied to the control terminals 22 has the polarity which causes the third and fourth transistors 14 and 15 to turn ON and OFF, respectively because of the charge of the capacitor 16 so far. Thus, the current I3 flows from the positive power source $V_{CC}$ to the negative power source $V_{EE}$ through the load resistor 19, the third transistor 14, the capacitor 16, the second transistor 12 and the constant-current source 13 in this order. The time constant of this current path is the same as that for the aforementioned other current path. Thus, the fourth transistor 15 switches from the OFF state to the ON state when the delay time t has passed. That is, as shown in (f) of FIG.3, the collector potential of the fourth transistor 15 decreases to the low level L when the delay time t has passed after the base potential of the first transistor 11 switches from the high level H to the low level L. In the above-mentioned manner, arbitrary delay time t is obtained without deteriorating the waveform of input data.

Figure 4:
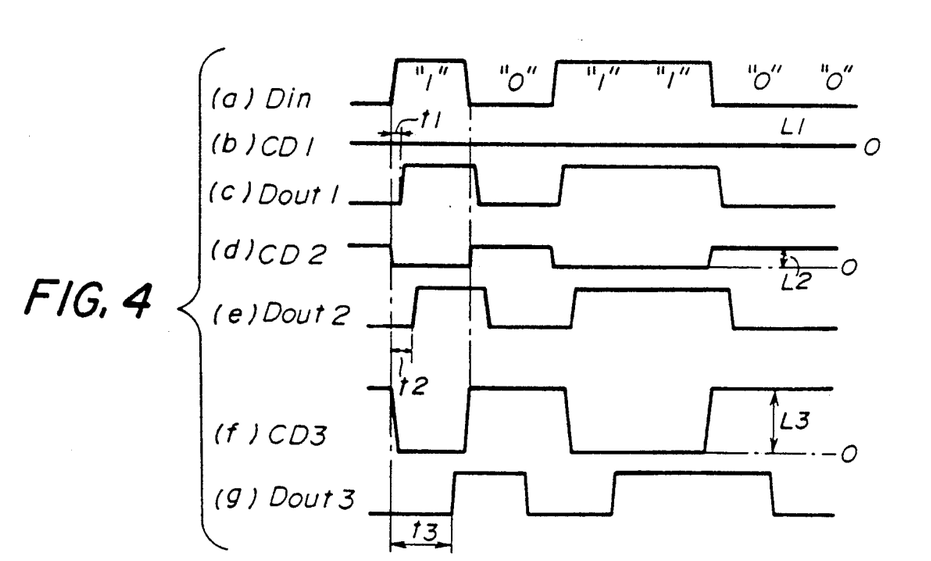
FIG.4 is a waveform diagram illustrating a delay time adjustment according to the embodiment of the present invention.

FIG.4 illustrates the delay time adjustment according to the present invention. When input data CD1, CD2 and CD3 having amplitude levels L1, L2 and L3 respectively, are separately applied to the input terminals 21, output data Dout1, Dout2 and Dout3 having delay times $t_1$, $t_2$ and $t_3$ respectively, are drawn from the output terminals 23. When input data CD1 having the amplitude level equal to zero is applied to the control terminals 22, the minimum delay time $t_1$ is obtained. When input data CD2 having the amplitude level L2 ($>$L1) is applied to the control terminals 22, delay time $t_2$ larger than the delay time $t_1$ is obtained. When input data CD3 having the amplitude L3 larger than L2 is applied to the control terminals 22, delay time $t_3$ larger than $t_2$ is obtained.

The use of differential pairs of transistors causes less waveform deterioration. The data delay circuit according to the present invention can give an arbitrary delay time to not only sine-wave signals but also high-speed data having a bit rate of a few giga-bits per second, for example.

Figure 5:
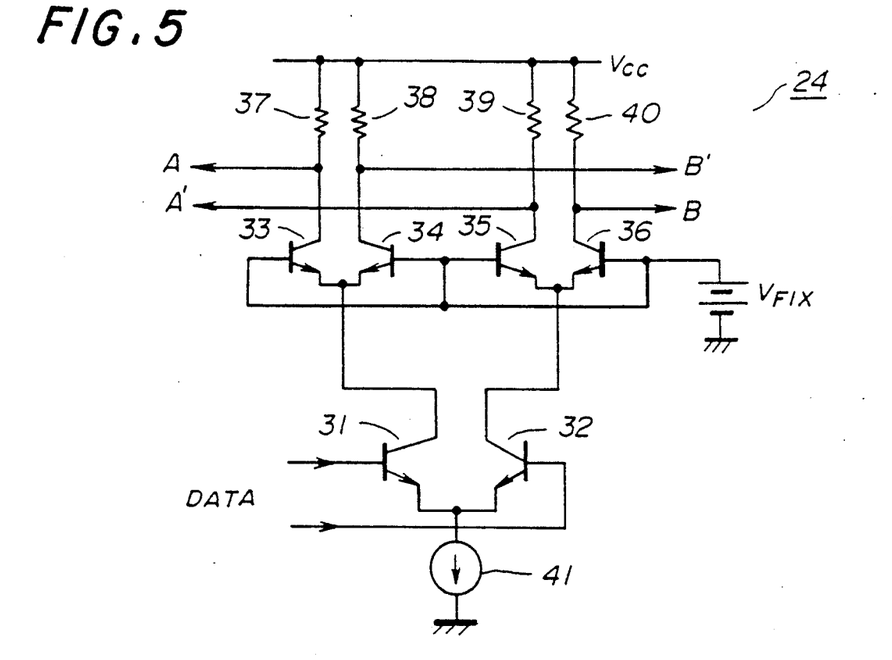
FIG.5 is a circuit diagram of a data division circuit used in the configuration shown in FIG.2.

FIG.5 is a circuit diagram of the data division circuit 24. The illustrated data division circuit 24 is made up of transistors 31 through 36, resistors 37 through 40, and a constant-current source 41. One of the transistors 31 and 32 forming a differential pair turns ON, and the other transistor turns OFF due to the polarity of data applied to the bases thereof. The bases of the transistors 33 through 36 are fixed to a potential $V_{FIX}$. The emitters of the transistors 33 and 34 are connected to the collector of the transistor 31, and the emitter of the transistor 35 and 36 are connected to the collector of the transistor 32. The collectors of the transistors 33-36 are coupled to the positive power source $V_{CC}$ through the resistors 37-40, respectively. Data A, A' (the aforementioned input data for example) are drawn from the collectors of the transistors 33 and 35 respectively, and data B, B' (the aforementioned control data for example) are drawn from the collectors of the transistors 34 and 36 respectively.

Figure 6:
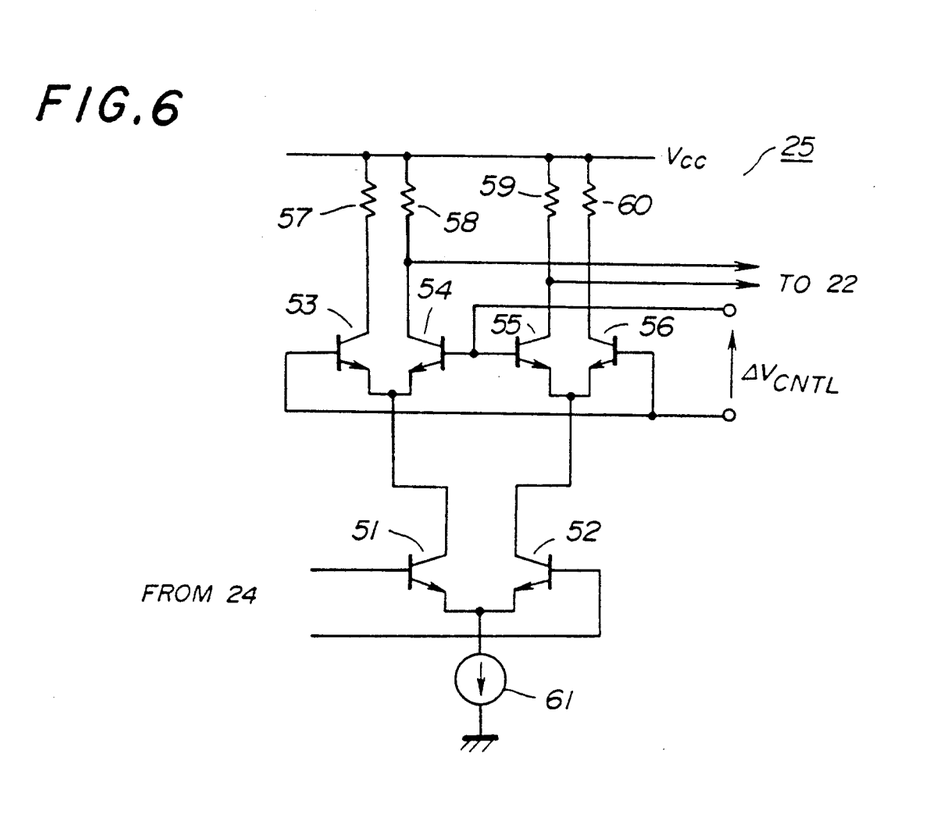
FIG.6 is a circuit diagram of an amplitude level adjustment circuit used in the configuration shown in FIG.2.

FIG.6 is a circuit diagram of the amplitude level adjustment circuit 25. The illustrated amplitude level adjustment circuit 25 is made up of transistors 51-56, resistors 57∝60 and a constant-current source 61. As shown in FIG.6, three differential pairs are formed by the transistors 51-56. A control voltage $\Delta V_{CNTL}$ is applied between the bases of the transistors 53, 54 and the bases of the transistors 55 and 56. The amplitude level of data drawn from the collector of the transistors 54 and 55 is controlled by the value of the control voltage $\Delta V_{CNTL}$.

Figure 7:
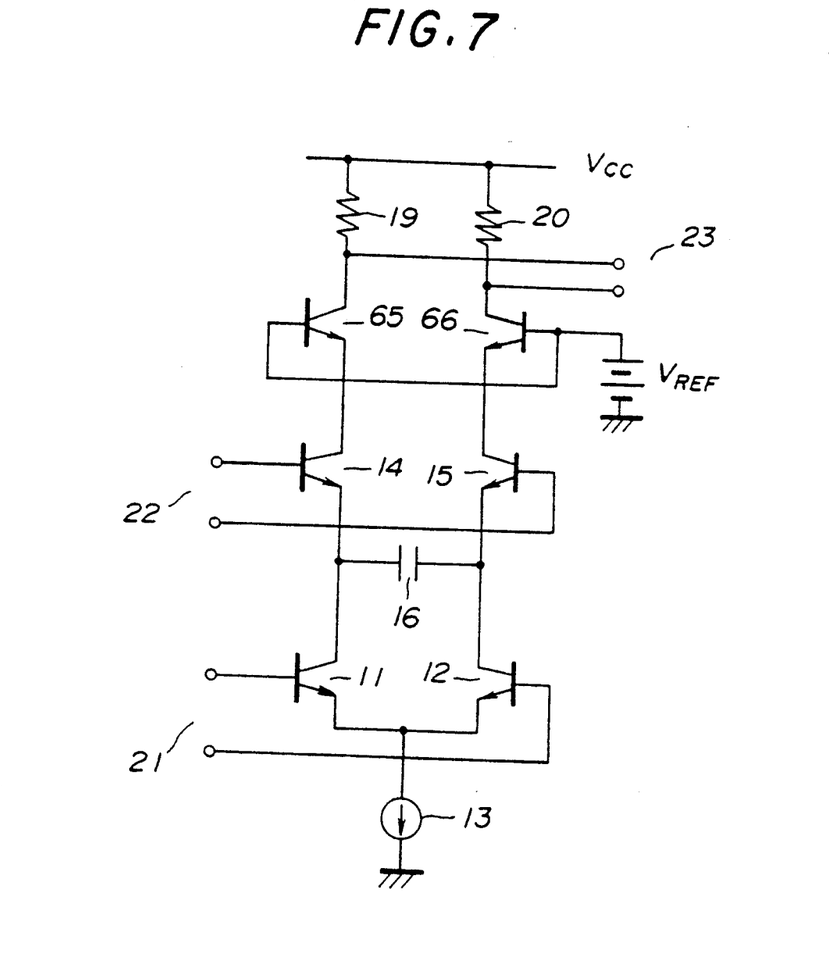
FIG.7 is a circuit diagram of a variation of the embodiment.

FIG.7 is a circuit diagram of a variation of the configuration shown in FIG.1. The illustrated variation includes a cascode configuration which has transistors 65 and 66. The collector and emitter of the transistor 65 are connected to the resistor 19 and the collector of the transistor 14, respectively. The collector and emitter of the transistor 66 are connected to the resistor 20 and the collector of the transistor 15. The bases of the transistors 65 and 66 are supplied with a constant voltage $V_{REF}$. The transistors 65 and 66 eliminate Miller capacitances and parasitic capacitances coupled to the transistors 14 and 15.

Figure 8:
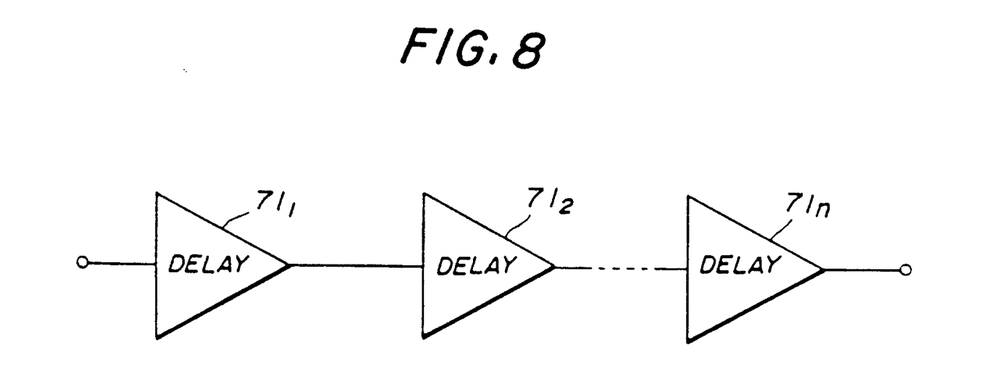
FIG.8 is a block diagram illustrating a second embodiment of the present invention.

It is noted that the delay time t is limited within one time slot of input data. In order to obtain a delay time larger than one time slot, a plurality of data delay circuits $71_1, 71_2, \ldots, 71_n$ each having the configuration shown in FIG.2 are cascaded as shown in FIG.8.

Figure 9A:
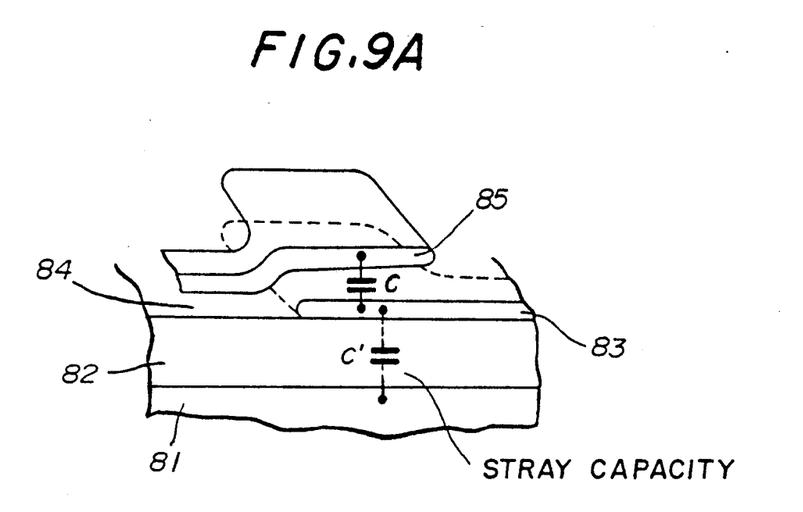
FIGS.9A through 9D are sectional views of layer structures for a capacitor.
Figure 10A:
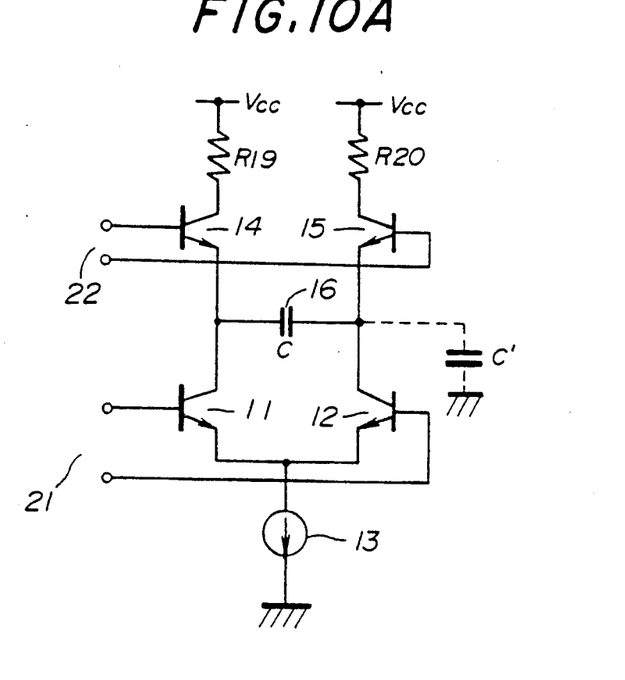
FIGS.10A through 10D are circuit diagrams of illustrating capacitors formed by the layer structures shown in FIGS.9A through 9D, respectively.

It is necessary to symmetrically configure the circuit shown in FIG.1. In this case, symmetry of circuit is greatly dependent on formation of the capacitor 16. When the capacitor 16 is formed by a layer structure shown in FIG.9A, a stray capacitance C' is coupled to the collector of the second transistor 12, for example. In FIG.9A, an insulating layer 82 of silicon oxide ($SiO_2$) for example, is formed on a substrate 81. An insulating layer 84 is sandwiched between an aluminum layer 83 at the first layer level and an aluminum layer 85 at the second layer level. The stray capacitor C' is formed between the aluminum layer 83 and the substrate 81. The stray capacitance C' destroys symmetry of the circuit as shown in FIG. 10A.

Figure 9B:
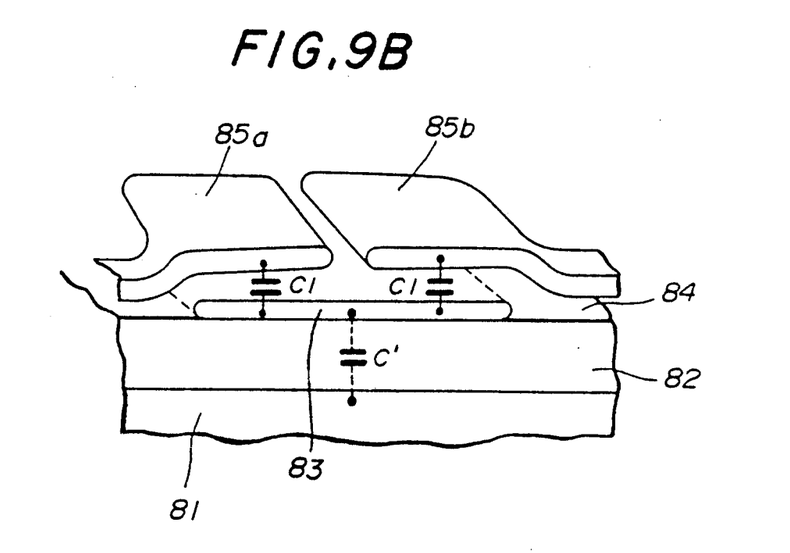
Figure 10B:
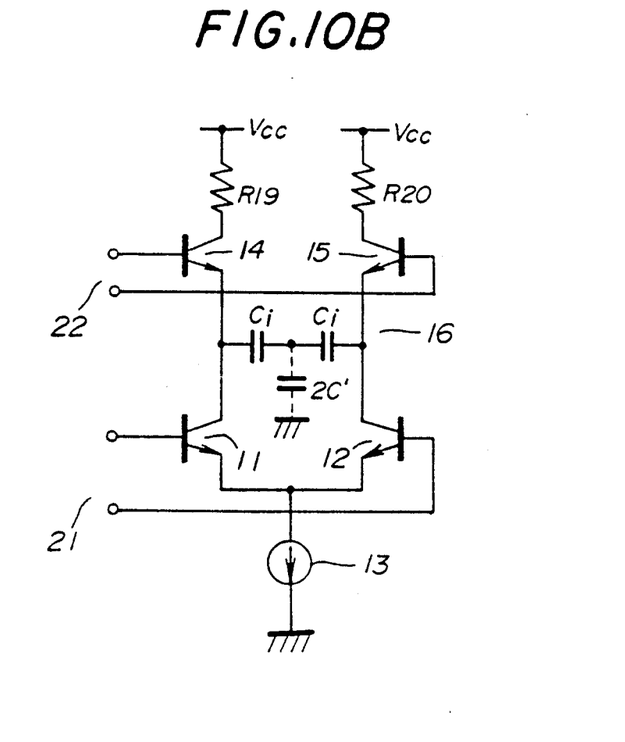

FIG.9B illustrates an improved layer structure of the capacitor 16. A pair of aluminum layers 85a and 85b at the second layer level is formed on the insulating layer 84 so as to be positioned above the aluminum layer at the first level. Two capacitors C1 are formed between the aluminum layer 83 and the aluminum layers 85a and 85b. In this case, the capacitor 16 is made up of the two capacitors C1 connected in series as shown in FIG.10B. Although stray capacitance 2C' is formed, they do not destroy symmetry of the circuit.

Figure 9C:
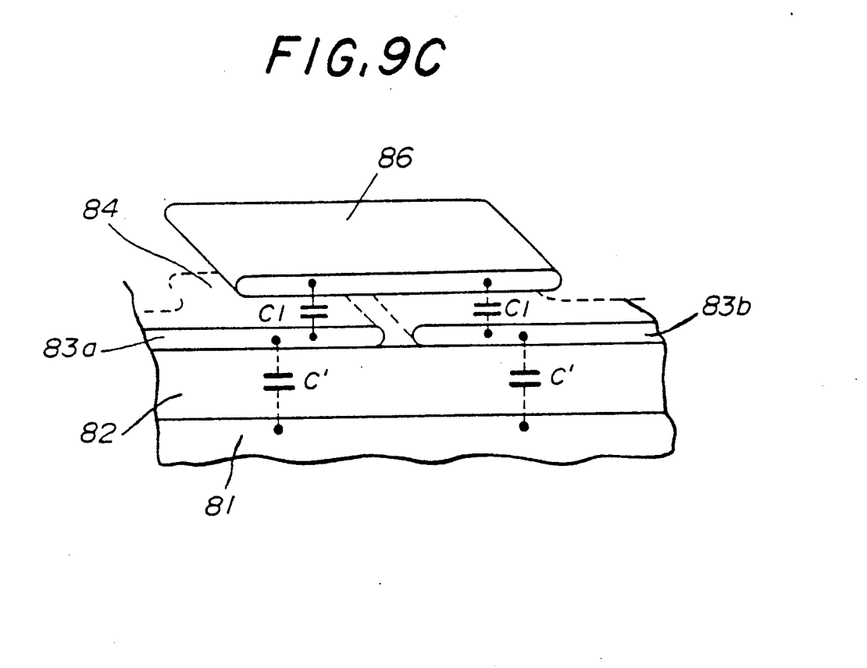
Figure 10C:
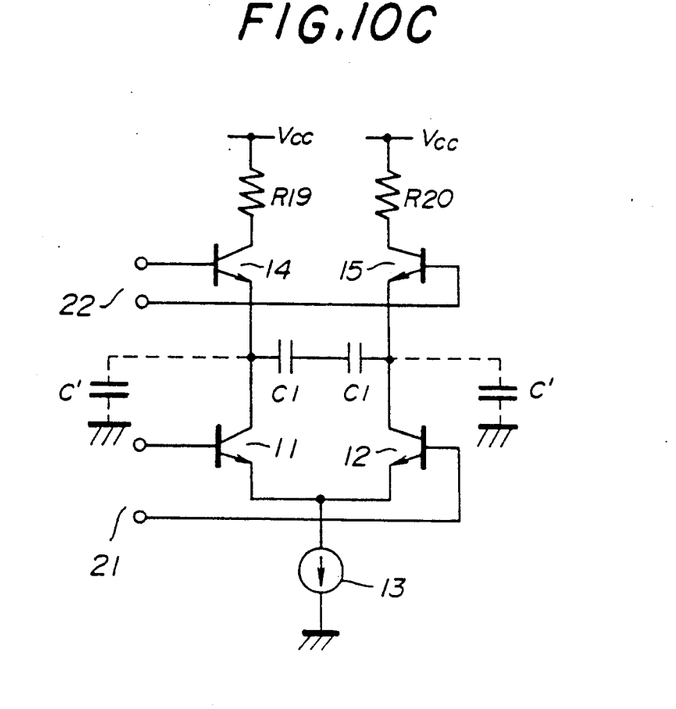

FIG.9C illustrates a second improved layer structure of the capacitor 16. A pair of aluminum layers 83a and 83b at the first layer level are formed on the insulating layer 82. An aluminum layer 86 at the second layer level extends above the aluminum layers 83a and 83b through the insulating film 84. Two capacitors C1 are formed between the aluminum layer 86 and the aluminum layers 83a and 83b. As shown in FIG.10C, the two capacitors C1 are connected in series. Stray capacitances C' are formed as shown in FIG.10C. Symmetry of the circuit is not destroyed even in the presence of stray capacitances C'.

Figure 9D:
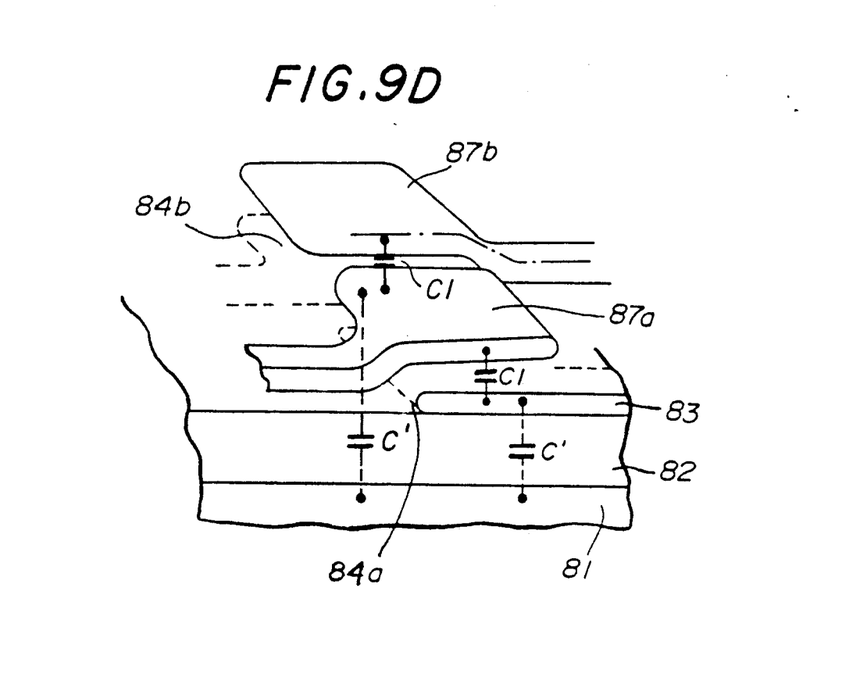
Figure 10D:
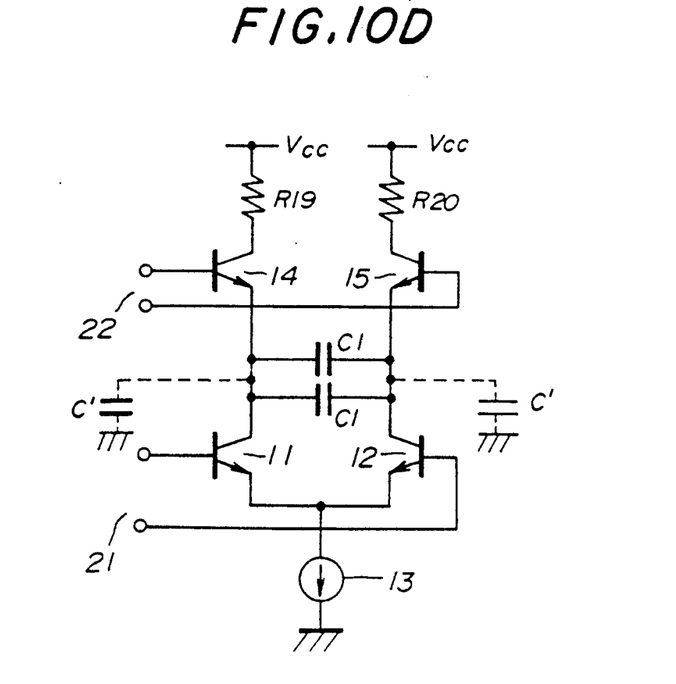

FIG.9D illustrates a third improved layer structure of the capacitor C. An aluminum layer 87a at the second layer level is formed on an insulating layer 84a so that it is located above the aluminum layer at the first level 83. Above the aluminum layer 87a is provided an aluminum layer 87b at the third layer level through an insulating layer 84b. A capacitor C1 is formed between the aluminum layers 83 and 87a, and another capacitor C1 is formed between the aluminum layers 87a and 87b. As shown in FIG.10D, the two capacitors C1 are connected in parallel. Symmetry of the circuit is not destroyed even in the presence of stray capacitances C'.

Figure 11:
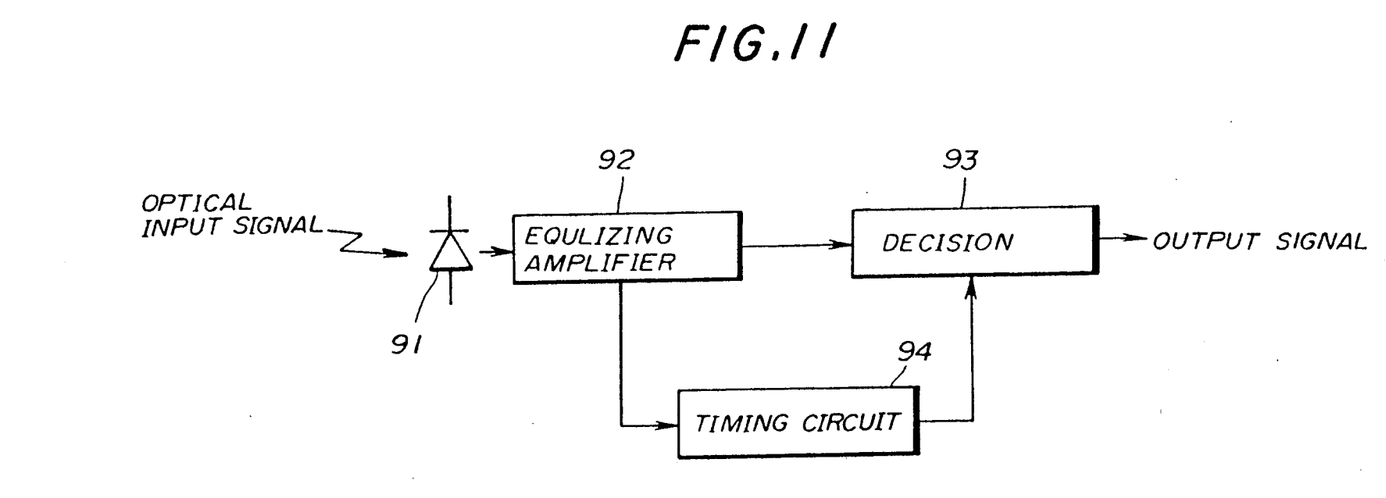
FIG.11 is a block diagram of an optical signal receiving circuit which employs the data delay circuit in its timing circuit according to the present invention.

FIG.11 is a block diagram of an optical signal receiving circuit which employs the data delay circuit according to the present invention. An optical input signal is converted into an electric signal by a light-receiving element 91 such as an avalanche photodiode. An equalizing amplifier 92 amplifies the converted electric signal. The amplified signal is supplied to a decision circuit 93 and a timing circuit 94. The timing circuit 94 extracts a timing clock signal from the amplified signal. The decision circuit 93 discriminates data contained in the amplified signal by using the extracted timing clock signal.

When the optical input signal is an NRZ signal, no spectrum of the bit frequency is contained in the optical input signal. For this reason, even when the received signal derived from the equalizing amplifier 92 passes through a filter (not shown) provided in the timing circuit 94, it is impossible to extract the timing clock signal from the received signal. Thus, there is a need to generate a spectrum component of the timing clock signal by the use of a non-linear timing extraction circuit.

Figure 12:
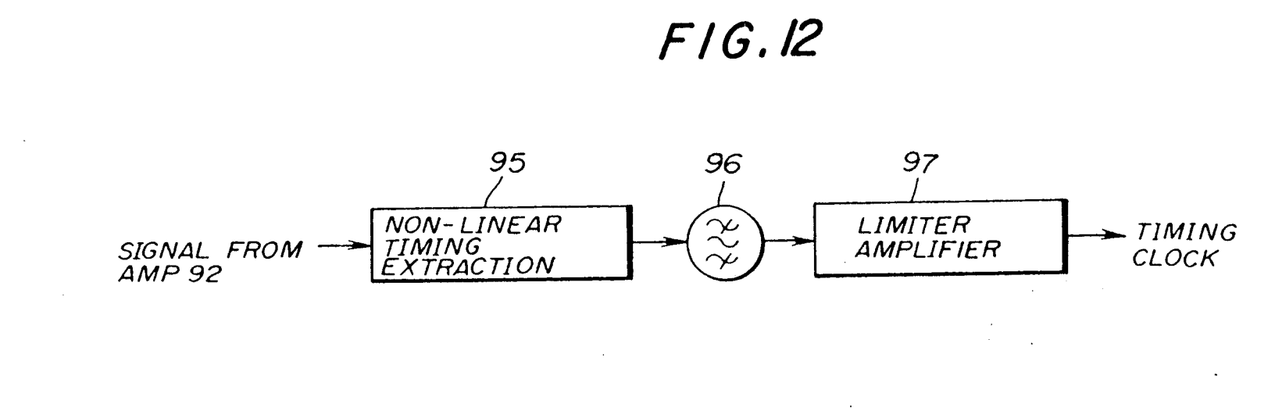
FIG.12 is a block diagram of a timing circuit shown in FIG.11.

FIG.12 is a block diagram of the timing circuit 94 which employs a non-linear extraction circuit 95. An output signal of the non-linear timing extraction circuit 95 having a spectrum component of the timing clock signal to be extracted passes through a narrow-bandpass filter 96 and a limiter amplifier 97.

Figure 13:
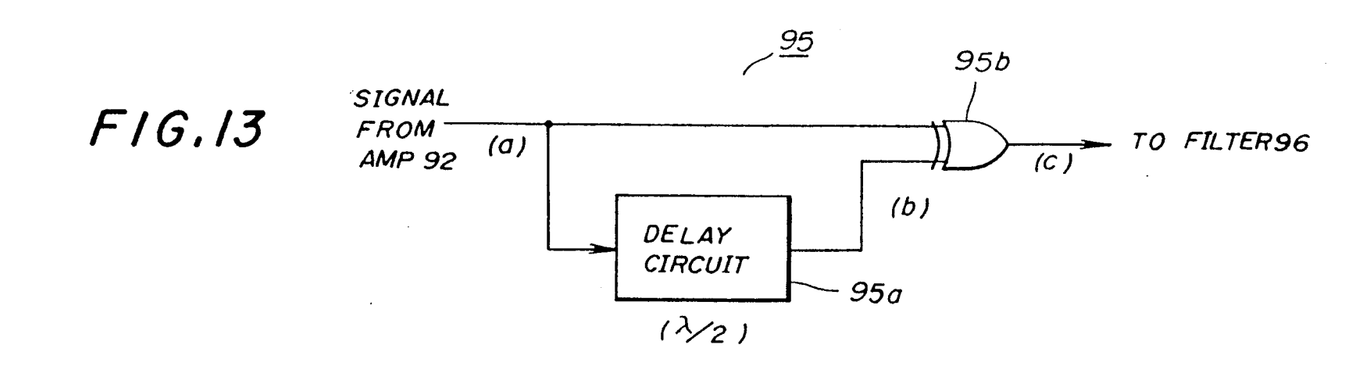
FIG.13 is a block diagram of a non-linear timing extraction circuit which is formed by the data delay circuit according to the present invention.
Figure 14:
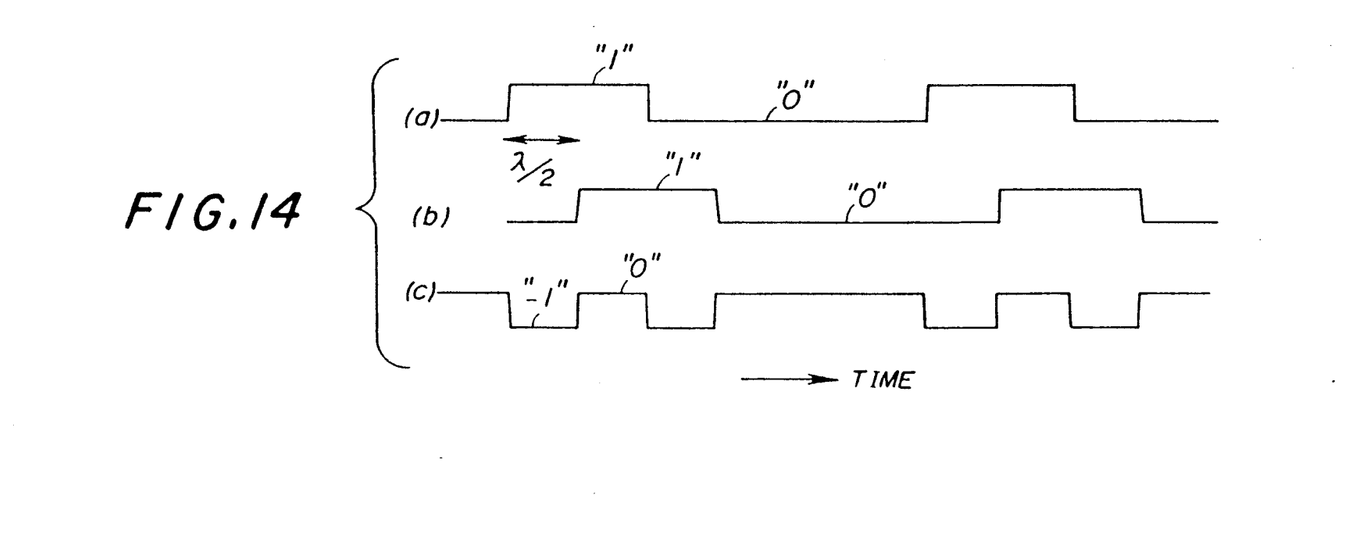
FIG.14 is a waveform diagram of signals observed at parts of the configuration shown in FIG.13.

FIG.13 is a block diagram of the structure for the non-linear timing extraction circuit 95. As illustrated, the non-linear timing extraction circuit 95 is made up of a delay circuit 95a and an exclusive-OR gate (hereinafter simply referred to as an EX-OR gate) 95b. Signal waveforms observed at parts (a), (b) and (c) shown in FIG.13 are illustrated in (a), (b) and (c) of FIG.14. The received signal (FIG.14-(a)) from the equalizing amplifier 92 (FIG.11) is applied to the delay circuit 95a and one of the two input terminals of the EX-OR gate 95b. The phase of the received signal applied to the delay circuit 95a is delayed by λ/2 (λ is a length of one time slot of the optical input signal) as shown in (b) of FIG.14 so that a delayed received signal is generated. This delayed received signal is applied to the other input terminal of the EX-OR gate 95b. As is well known, the EX-OR gate 95b generates data "0" when the two inputs are both "1" or "0", and generates data "1" when one of the two inputs is "1" and the other input is "0". Thus, a pulse component shown in (c) of FIG.14 is obtained at the output terminal of the EX-OR 95b. The generated pulse component shown in (c) of FIG.14 passes through the narrow-bandpass filter 96 and limiter amplifier 97 (FIG.12) so that the timing clock signal to be applied to the decision circuit 93 (FIG.11) is obtained.

The delay circuit 95a is configured by the data delay circuit according to the present invention. That is, the configuration shown in FIG.2 is applied to the delay circuit 95a.

Alternatively, it is possible to form the capacitor 16 by a variable-capacitance capacitor which is controlled by a voltage applied thereto so that the delay time is adjusted based on capacitance of the capacitor 16. In this case, the amplitude of the control data may be fixed. However, in actually, this arrangement is complex as compared with the aforementioned embodiments. It is also possible to form the constant-current source 13 by a variable constant-current source. In this case, the amplitude of the output data drawn from the output terminals 23 (FIG.1) changes in accordance with a change of the constant current I. From this point of view, the aforementioned configuration is superior to the employment of the variable constant-current source.

The present invention is not limited to the aforementioned embodiments, and variations and modifications may be made without departing from the scope of the present invention.

What is claimed is:

1. A data delay circuit connectable to receive first and second voltages, to receive input data having a first polarity and to receive control data having a second polarity opposite the first polarity and having an amplitude level corresponding to a desired delay time of the input data, and comprising:

a first transistor having a base connectable to receive the input data, an emitter and a collector;
a second transistor having a base connectable to receive the input data, an emitter and a collector;
a constant-current source coupled to the emitters of said first and second transistors and to receive the first voltage;
a capacitor coupled between the collector of said first transistor and the collector of said second transistor;
a third transistor having a base connectable to receive the control data, a collector, and an emitter coupled to the collector of said first transistor;
a fourth transistor having a base connectable to receive the control data, a collector, and an emitter coupled to the collector of said second transistor,; and
first and second load resistors respectively coupled to the collectors of said third and fourth transistor and to receive the second voltage,
delayed input data being drawn from the collectors of said third and fourth transistors.

2. A data delay circuit as claimed in claim 1, further comprising:
first means for generating inverted input data based on the input data; and
second means for adjusting an amplitude level of the inverted input data in accordance with the desired delay time and for providing the delayed inverted input data as the control data.

3. A data delay circuit as claimed in claim 1, further comprising:
a second constant-current source coupled to the collector of said first transistor and to receive the first voltage, and a third constant-current source coupled to the collector of said second transistor and to receive the first voltage.

4. A data delay circuit as claimed in claim 1, wherein said capacitor comprises a plurality of capacitors connected in series.

5. A data delay circuit as claimed in claim 1, wherein said capacitor comprises a plurality of capacitors connected in parallel.

6. A data delay circuit as claimed in claim 1, wherein said capacitor comprises a variable-capacitance diode having a variable capacitance dependent on the desired delay time.

7. A data delay circuit as claimed in claim 1, wherein said constant-current source includes means for providing a variable constant current to vary the amplitude said delayed input data.

8. A data delay circuit as claimed in claim 1, further comprising:
fifth and sixth transistors coupled to the collectors of said third and fourth transistors.

9. A data delay circuit as claimed in claim 2, wherein said first means comprises:
differential pair means for amplifying the input data to generate a current signal and an inverted current signal;
first transistor pair means for dividing the current signal into a first current signal and a second current signal; and
second transistor pair means for dividing the inverted current signal into a third current signal and a fourth current signal.

10. A data delay circuit as claimed in claim 2, wherein said second mens comprises:
differential pair means for amplifying the inverted input data to generated a current signal and an inverted current signal;
first transistor pair means for dividing the current signal into a first current signal and a second current signal in proportion to a reference voltage corresponding to the adjusted amplitude level; and
second transistor pair means for dividing the inverted current signal into a third current signal and a fourth current signal in proportion to the reference voltage corresponding to the adjusted amplitude level.

11. A data delay circuit connectable to receive first and second voltages, to receive input data having a first plurality and to receive control data having a second polarity opposite the first polarity and having an amplitude level corresponding to a desired delay time of the input data, and comprising:
a plurality of delay circuits cascaded, each of said delay circuits including:
a first transistor having a base connectable to receive the input data, an emitter and a collector;
a second transistor having abase connectable to receive the input data, an emitter and a collector;
a constant-current source coupled to the emitters of said first and second transistors and to receive the first voltage;
a capacitor coupled between the collector of said first transistor and the collector of said second transistor;
a third transistor having a base connectable to receive the control data, a collector, and an emitter coupled to the collector of said first transistor;

a fourth transistor having a base connectable to receive the control data, a collector, and an emitter coupled to the collector of said second transistor;

first and second load resistors respectively coupled to the collectors of said third and fourth transistor and to receive the second voltage;

delayed input data being drawn from the collectors of said third and fourth transistors;

first means for generating inverted input data based on the input data; and second means for adjusting an amplitude level of the inverted input data in accordance with the desired delay time and for providing the delayed inverted input data as the control data.

12. A data delay circuit as claimed in claim 11, wherein each of said delay circuits comprises;

a second constant-current source coupled to the collector of said first transistor and to receive the first voltage, and a third constant-current source coupled to the collector of said second transistor and to receive the first voltage.

13. A timing extraction circuit comprising:

data delay circuit connectable to receive first and second voltages, to receive input data having a first polarity and to receive control data having a second polarity opposite the first polarity and having an amplitude level corresponding to a desired delay time of the input data, and having an input terminal and an output terminal; and an exclusive-OR gate having a first input terminal connectable to receive the input data, a second input terminal coupled to the output terminal of said data delay circuit, and an output terminal which outputs an extracted pulse, said data delay circuit includes:

a first transistor having a base connectable to receive the input data, an emitter and a collector;

a second transistor having a base connectable to receive the input data from said input terminal of said data delay circuit, an emitter and a collector;

a constant-current source coupled to the emitters of said first and second transistors and to receive the first voltage;

a capacitor coupled between the collector of said first transistor and the collector of said second transistor;

a third transistor having a base connectable to receive the control data, a collector, and an emitter coupled to the collector of said first transistor;

a fourth transistor having a base connectable to receive the control data, a collector, and an emitter coupled to the collector of said second transistor;

first and second load resistors respectively coupled to the collectors of said third and fourth transistor and to receive the second voltage;

delayed input data being drawn from the collectors of said third and fourth transistors through said output terminal of said data delay circuit;

first means for generating inverted input data based on the input data; and second means for adjusting an amplitude level of then inverted input data in accordance with the desired delay time and for providing the delayed inverted input data as the control data.

14. A timing extraction circuit as claimed in claim 13, wherein each of said delay circuits comprises:

a second constant-current source coupled to the collector of said first transistor and to receive the first voltage, and a third constant-current source coupled to the collector of said second transistor and to receive the first voltage.

15. A timing circuit comprising:

a timing extraction circuit receiving input data and outputting an extracted pulse;

narrow-bandpass filter means for filtering said extracted pulse to generate a filtered extracted pulse; and limiter amplifying means for amplifying and limiting an amplitude level of said filtered extracted pulse, said timing extraction circuit including:

data delay circuit connectable to receive first and second voltages, to receive input data having a first polarity and to receive control data having a second polarity opposite the first polarity and having an amplitude level corresponding to a desired delay time of the input data, and having an input terminal and an output terminal; and an exclusive-OR gate having a first input terminal connectable to receive the input data, a second input terminal coupled to the output terminal of said data delay circuit, and an output terminal which outputs an extracted pulse, said data delay circuit including:

a first transistor having a base connectable to receive input data, an emitter and a collector;

a second transistor having a base connectable to receive the input data from said input terminal of said data delay circuit, an emitter and a collector;

a constant-current source coupled to the emitters of said first and second transistor sand to receive the first voltage;

a capacitor coupled between the collector of said first transistor and the collector of said second transistor;

a third transistor having a base connectable to receive the control data, a collector, and an emitter coupled to the collector of said first transistor;

a fourth transistor having a base connectable to receive the control data, a collector, and an emitter coupled to the collector of said second transistor;

first and second load resistors respectively coupled to the collectors of said third and fourth transistor and to receive the second voltage;

delayed input data being drawn from the collectors of said third and fourth transistors through said output terminal of said data delay circuit;

first means for generating inverted input data based on the input data; and second means for adjusting an amplitude level of the inverted input data in accordance with the desired delay time and for providing the delayed inverted input data as the control data.

* * * * *

UNITED STATES PATENT AND TRADEMARK OFFICE
CERTIFICATE OF CORRECTION

PATENT NO. : 5,066,877
DATED : November 19, 1991
INVENTOR(S) : Hamano et al.

It is certified that error appears in the above-identified patent and that said Letters Patent is hereby corrected as shown below:

```
col. 1, line 6, change "fled" to --filed--;
col. 7, line 11, change "57 ∝ 60" to --57-60--;
col. 10, line 49, change "plurality to --polarity--;
     line 58, change "abase" to --a base--;
col. 11, line 62, change "then" to --the--;
col. 12, line 40, change "transistor sand" to
--transistors and--.
```

Signed and Sealed this

Twenty-second Day of June, 1993

Attest:

MICHAEL K. KIRK

*Attesting Officer*    *Acting Commissioner of Patents and Trademarks*